(12) United States Patent
Cha

(10) Patent No.: US 10,721,830 B2
(45) Date of Patent: Jul. 21, 2020

(54) WATERPROOF DISPLAY DEVICE AND PORTABLE TERMINAL

(71) Applicant: SAMSUNG DISPLAY CO., LTD., Yongin-si, Gyeonggi-do (KR)

(72) Inventor: Jae-Lok Cha, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 8 days.

(21) Appl. No.: 16/242,178

(22) Filed: Jan. 8, 2019

(65) Prior Publication Data

US 2019/0239374 A1 Aug. 1, 2019

(30) Foreign Application Priority Data

Jan. 8, 2018 (KR) .......... 10-2018-0002397

(51) Int. Cl.
| | |
|---|---|
| *H05K 5/06* | (2006.01) |
| *H04M 1/02* | (2006.01) |
| *H04M 1/18* | (2006.01) |
| *H01L 51/00* | (2006.01) |
| *H01L 51/52* | (2006.01) |
| *H05K 1/18* | (2006.01) |
| *H05K 5/00* | (2006.01) |

(52) U.S. Cl.
CPC ......... *H05K 5/065* (2013.01); *H01L 51/0097* (2013.01); *H01L 51/5246* (2013.01); *H04M 1/0202* (2013.01); *H04M 1/0266* (2013.01); *H04M 1/18* (2013.01); *H05K 1/189* (2013.01); *H05K 5/0086* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 9,272,497 B2 * | 3/2016 | Khadilkar | ............... B32B 37/12 |
| 2009/0302760 A1 * | 12/2009 | Tchakarov | .......... H01L 51/5203 |
| | | | 313/512 |

(Continued)

FOREIGN PATENT DOCUMENTS

| | | |
|---|---|---|
| EP | 3 151 524 | 4/2017 |
| EP | 3 418 854 | 12/2018 |

(Continued)

*Primary Examiner* — Daniel P Wicklund
*Assistant Examiner* — Christopher L Augustin
(74) *Attorney, Agent, or Firm* — F. Chau & Associates, LLC

(57) ABSTRACT

A display device includes a window member having a flat portion and a bent portion connected to the flat portion. A display panel is disposed on a rear surface of the window member and includes a central portion and a corner portion protruding from the central portion and overlapping with the flat portion and the bent portion. A first sealing member is disposed on a rear surface of the display panel and overlaps with the corner portion. A second sealing member is disposed on the rear surface of the window member and is spaced apart from the central portion and the corner portion. A first adhesive contacts the first sealing member and the second sealing member and seals a space which is defined between the first sealing member and the second sealing member in the flat portion.

21 Claims, 9 Drawing Sheets

(56) References Cited

U.S. PATENT DOCUMENTS

| | | | | |
|---|---|---|---|---|
| 2011/0209890 | A1* | 9/2011 | Yamaguchi | H05K 5/069 174/50.5 |
| 2014/0183473 | A1* | 7/2014 | Lee | H01L 51/0097 257/40 |
| 2015/0162392 | A1 | 6/2015 | Lim et al. | |
| 2015/0245513 | A1* | 8/2015 | Moon | G06F 1/20 361/679.01 |
| 2017/0099742 | A1* | 4/2017 | Choi | H04M 1/18 |
| 2018/0004330 | A1* | 1/2018 | Kim | G06F 3/0412 |

FOREIGN PATENT DOCUMENTS

| KR | 10-2012-0033979 | 4/2012 |
|---|---|---|
| KR | 10-1389480 | 4/2014 |
| KR | 10-2017-0040082 | 4/2017 |

\* cited by examiner

WATERPROOF DISPLAY DEVICE AND PORTABLE TERMINAL

CROSS-REFERENCE TO RELATED APPLICATION

This application claims priority to Korean Patent Application No. 10-2018-0002397, filed on Jan. 8, 2018, and all the benefits accruing therefrom under 35 U.S.C. § 119, the content of which is incorporated by reference herein in its entirety.

TECHNICAL FIELD

The present disclosure relates to a display device and, more particularly, to a waterproof display device and a portable terminal.

DISCUSSION OF THE RELATED ART

Portable terminals are small electronic devices that can be easily carried by a user and may be configured to perform various functions. Examples of portable terminals include smartphones, point-of-sale devices, and various specialized electronic tools used by people. Portable terminals often include display devices for displaying information and images to the user. Users frequently use portable terminals in various environments, and thus portable terminals may be made waterproof to prevent damage that may otherwise be caused by exposure to liquids.

In addition, portable terminals may have curved surfaces for reasons of appearance and/or convenience. A curved portable terminal may include a display panel of which at least a portion is curved, and various components coupled to the display panel. Since the display panel is curved, water may more easily permeate into the curved portable terminal through a curved area, in which internal components of the portable terminal may be disposed more closely to an outer surface of the portable terminal.

SUMMARY

A display device includes a window member having a flat portion and a bent portion connected to the flat portion. A display panel is disposed on a rear surface of the window member and includes a central portion and a corner portion protruding from the central portion and overlapping with the flat portion and the bent portion. A first sealing member is disposed on a rear surface of the display panel and overlaps with the corner portion. A second sealing member is disposed on the rear surface of the window member and is spaced apart from the central portion and the corner portion. A first adhesive contacts the first sealing member and the second sealing member and seals a space which is defined between the first sealing member and the second sealing member in the flat portion.

A display device includes a window member having a flat portion and a bent portion connected to the flat portion. A display panel is disposed on a rear surface of the window member. A compensation part is disposed on the rear surface of the window member, protrudes from the display panel, and overlaps with the flat portion and the bent portion. A first sealing member is disposed on a rear surface of the display panel and a rear surface of the compensation part and overlaps with the compensation part. A second sealing member is disposed on the rear surface of the window member and is spaced apart from the display panel and the compensation part. A first adhesive contacts the first sealing member and the second sealing member and seals a space which is defined between the first sealing member and the second sealing member in the flat portion.

A portable terminal includes a window member having a flat portion and a bent portion connected to the flat portion. A display panel is disposed on a rear surface of the window member and includes a central portion and a corner portion protruding from the central portion and overlaps with the flat portion and the bent portion. A first sealing member is disposed on a rear surface of the display panel and overlaps with the corner portion. A second sealing member is disposed on the rear surface of the window member and is spaced apart from the central portion and the corner portion. A first adhesive contacts the first sealing member and the second sealing member and seals a space which is defined between the first sealing member and the second sealing member in the flat portion.

A display device includes a front window and a back case. A curved display panel is disposed between the front window and the back case and includes a first-side bending area, a second-side bending area and a flat area disposed between the first-side bending area and the second-side bending area. A first-side sealing member is disposed between the curved display panel and the back case. The first-side sealing member overlaps with the first-side bending area and the flat area. A second-side sealing member is disposed between the curved display panel and the back case. The second-side sealing member overlaps with the second-side bending area and the flat area. An adhesive is disposed in contact with the first-side sealing member and the second-side sealing member and overlaps with the flat area and not the first-side bending area or the second-side bending area.

BRIEF DESCRIPTION OF THE DRAWINGS

The above and other aspects and features of the present invention will become more apparent by describing in further detail exemplary embodiments thereof with reference to the accompanying drawings, in which.

DETAILED DESCRIPTION OF THE EMBODIMENTS

Figure 1:
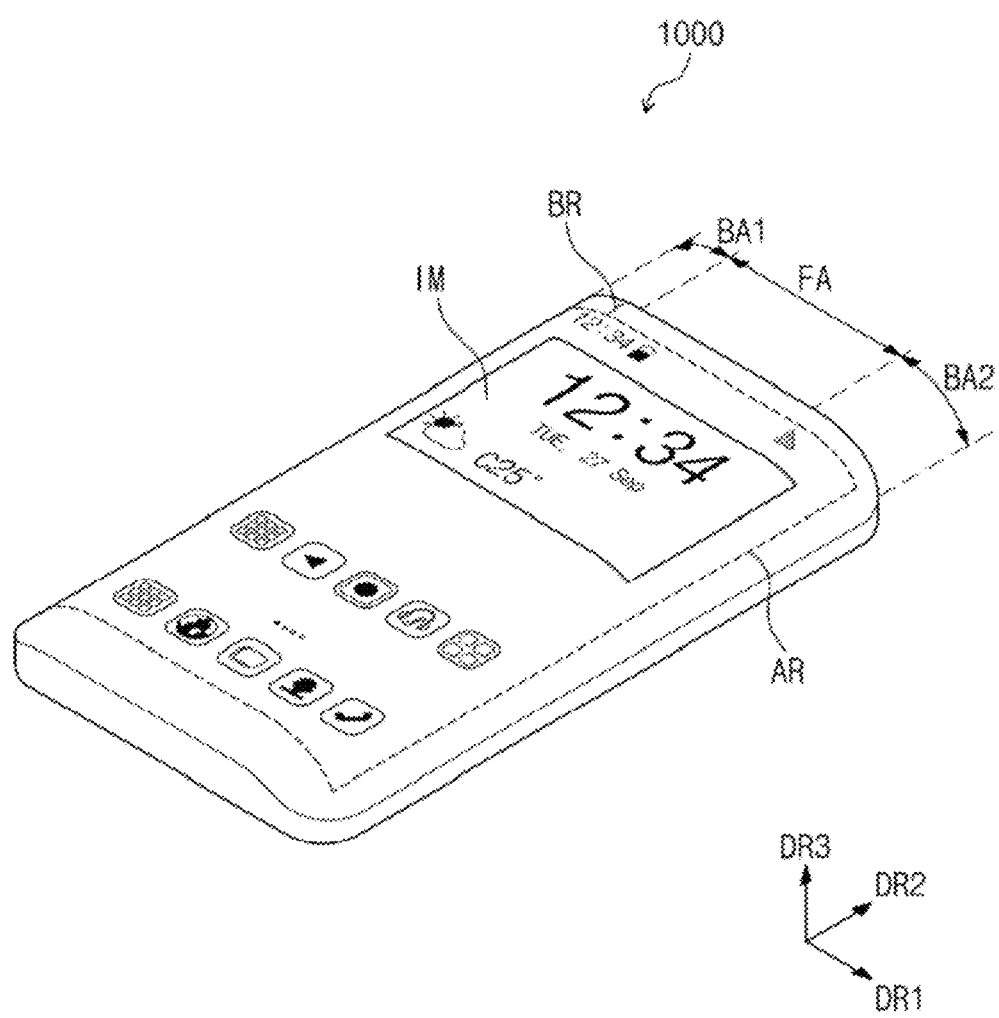
FIG. 1 is a perspective view illustrating a display device according to exemplary embodiments of the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals may refer to like elements throughout the specification and figures. It will be understood that when an element such as a layer, region or substrate is referred to as being "on" another element, it can be directly on the other element or intervening elements may be present.

Figure 2:
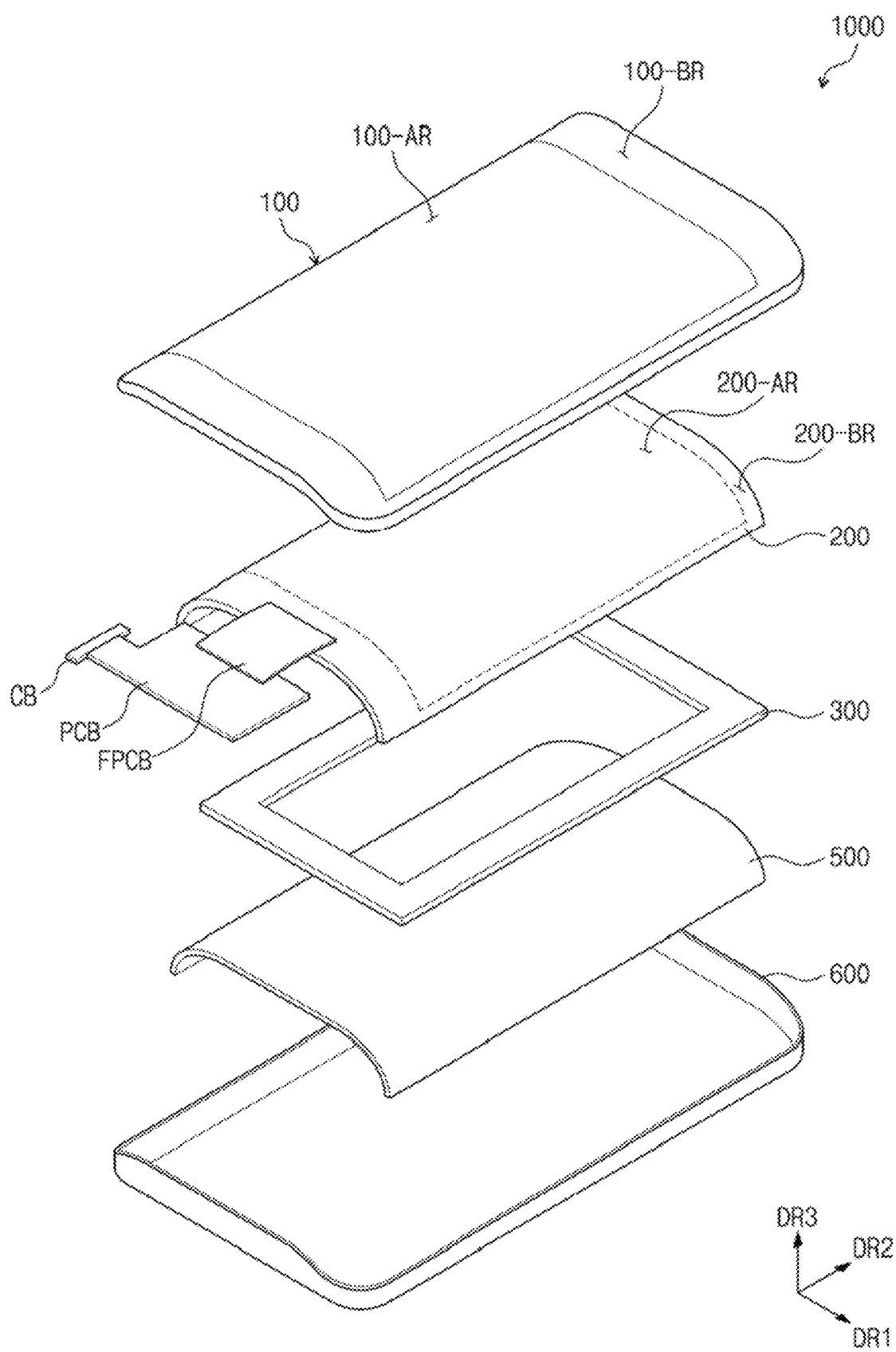
FIG. 2 is an exploded perspective view illustrating the display device of FIG. 1.

FIG. 1 is a perspective view illustrating a display device according to exemplary embodiments of the present invention, and FIG. 2 is an exploded perspective view illustrating the display device of FIG. 1.

In FIG. 1, a portable terminal including a display device is illustrated as an exemplary embodiment of the present invention. The portable terminal may be a tablet personal computer (tablet PC), a smart phone, a personal digital assistant (PDA), a portable multimedia player (PMP), a game console, or a watch-type electronic device. However, embodiments of the invention are not limited thereto. The display device, according to exemplary embodiments of the present invention, may be applied to large-sized electronic devices (e.g., televisions and/or electronic billboards) and small and middle-sized electronic devices (e.g., personal computers, notebook computers, car navigation units, and/or cameras). However, these are provided only as examples of the invention, and the terminal including the display device, according to the invention, may also be applied to other electronic devices without departing the spirits and scopes of the invention.

As illustrated in FIG. 1, the display device/portable terminal 1000, according to exemplary embodiments of the present invention, may include a plurality of areas divided from each other in a display surface. The display device 1000 may include a display area AR in which an image IM is displayed, and a non-display area BR adjacent to the display area AR. For example, the display area AR may have a quadrilateral shape (e.g., a rectangular shape) when viewed in a plan view. The non-display area BR may at least partially surround the display area AR, for example, the non-display area BR may surround the display area AR on a top side and a bottom side.

The display device 1000 may have a shape which is partially bent. The display device 1000 may include a flat portion FA, which is substantially flat, and bent portions BA1 and BA2, which are substantially bent, which are each connected to the flat portion FA.

The flat portion FA may lie parallel to a plane defined by a first direction DR1 and a second direction DR2. A normal direction of the flat portion FA may be indicated by a third direction DR3. The third direction DR3 may be a reference direction for defining a front surface and a rear surface of each member of the display device 1000. However, the directions may be relative concepts and may be alternatively contemplated.

The bent portions BA1 and BA2 may include a first bent portion BA1 and a second bent portion BA2. The first bent portion BA1 and the second bent portion BA2 may be opposite to each other in the first direction DR1 with the flat portion FA interposed therebetween. The first bent portion BA1 and the second bent portion BA2 may be parallel to each other. In FIG. 1, the first bent portion BA1 and the second bent portion BA2 extend primarily in the second direction DR2. In FIG. 1, the two bent portions BA1 and BA2 are illustrated as an example. However, exemplary embodiments of the present invention are not limited thereto. In an exemplary embodiment of the present invention, the display device 1000 may include only one of the first bent portion BA1 and the second bent portion BA2.

A portion of the display area AR may be disposed in the flat portion FA, and another portion of the display area AR may be disposed in one or both of the bent portions BA1 and BA2. FIG. 1 illustrates an example in which the image IM is displayed in the display area AR.

Referring to FIGS. 1 and 2, the display device 1000 may include a window member 100, a display panel 200, a waterproof member 300, a bracket 500, and a back case 600.

Each of the window member 100, the display panel 200 and the bracket 500 may have a partially bent shape. Each of the window member 100, the display panel 200 and the bracket 500 may include a flat portion and a bent portion. The flat portion of each of the window member 100, the display panel 200 and the bracket 500 may correspond to the flat portion FA of the display device 1000, and the bent portion of each of the window member 100, the display panel 200 and the bracket 500 may correspond to the bent portions BA1 and BA2 of the display device 1000. For the purpose of ease and convenience in description, the flat portion FA and the bent portions BA1 and BA2 may be used to mean the flat portion and the bent portion of each of the window member 100, the display panel 200 and the bracket 500. For example, the flat portion of the display panel 200 may mean a portion of the display panel 200, which forms the flat portion FA.

The window member 100 may include a display area 100-AR transmitting the image IM provided from the display panel 200 and a non-display area 100-BR adjacent to the display area 100-AR.

The window member 100 may be disposed on the display panel 200. The window member 100 may include a cover window formed of glass, sapphire, or plastic.

The window member 100 may have a front surface and a rear surface, which are opposite to each other. In FIG. 2, the front surface of the window member 100 may be defined as a surface from which an image exits, and the rear surface of the window member 100 may be defined as a surface adjacent to the display panel 200.

The display panel 200 may include a display area 200-AR and a non-display area 200-BR. The display area 200-AR may be an area displaying the image IM and may correspond to the display area 100-AR of the window member 100. The non-display area 200-BR may be adjacent to the display area 200-AR and may correspond to the non-display area 100-BR of the window member 100.

The display panel 200 may be, but is not limited to being, a light emitting display panel. For example, the display panel 200 may be an organic light emitting display panel or a quantum-dot light emitting display panel. The organic light emitting display panel may include a light emitting layer including an organic light emitting material. The quantum-dot light emitting display panel may include a light emitting layer including quantum dots and/or quantum rods. Hereinafter, the organic light emitting display panel will be described as an example of the display panel 200.

The display panel 200 may have a display surface displaying the image IM and a rear surface opposite to the display surface. In FIG. 2, the display surface of the display panel 200 may be defined as a surface adjacent to the window member 100, and the rear surface of the display panel 200 may be defined as a surface adjacent to the bracket 500.

FIG. 2 schematically illustrates the shape of the display panel 200. However, a detailed shape of the display panel 200 will be described later.

The display device 1000 may further include a flexible printed circuit board FPCB and a printed circuit board PCB.

The flexible printed circuit board FPCB may electrically connect the display panel 200 to the printed circuit board PCB. One end of the flexible printed circuit board FPCB may be connected to a surface of the display panel 200, and another end of the flexible printed circuit board FPCB may be connected to the printed circuit board PCB. The flexible printed circuit board FPCB may be flexible.

The flexible printed circuit board FPCB may be bent so as to be disposed under the display panel 200. Alternatively, a portion of the display panel 200, to which the flexible printed circuit board FPCB is attached, may be bent such that the flexible printed circuit board FPCB may be disposed under the display panel 200.

In an exemplary embodiment of the present invention, when the display panel 200 is connected directly to the printed circuit board PCB, the flexible printed circuit board FPCB may be omitted.

The printed circuit board PCB may provide signals to the display panel 200 through the flexible printed circuit board FPCB and/or may receive signals from the display panel 200 through the flexible printed circuit board FPCB. Since the flexible printed circuit board FPCB is bent, the printed circuit board PCB may be attached to the rear surface of the display panel 200 in a state in which the printed circuit board PCB is connected or coupled to the flexible printed circuit board FPCB. A connector CB for receiving signals from an external source may be connected to the printed circuit board PCB.

The waterproof member 300 may be disposed between the display panel 200 and the bracket 500. One surface of the waterproof member 300 may be adhered to the display panel 200, and another surface of the waterproof member 300 may be adhered to the bracket 500. The water proof member 300 may function as a washer pad and may prevent water from permeating between the display panel 200 and the bracket 500 by closing off any spaces or voids that may exist therebetween.

The bracket 500 may support the display panel 200. One surface of the bracket 500 may be adhered to the display panel 200, and a space in which electronic components are disposed may be provided on another surface of the bracket 500.

The back case 600 may be coupled to the window member 100 to receive the display panel 200. The back case 600 may be formed of a plastic, a metal, or a glass. In an exemplary embodiment of the present invention, the back case 600 may be omitted.

Figure 3:
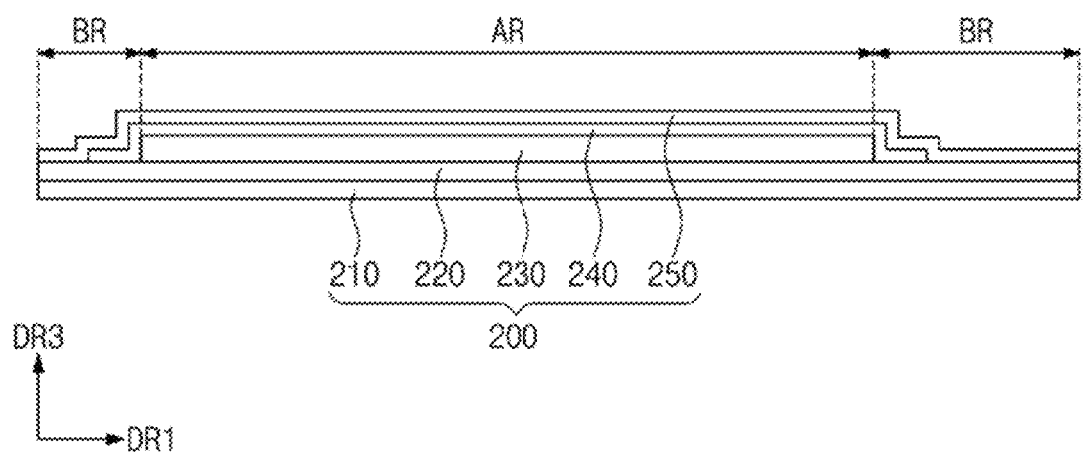
FIG. 3 is a cross-sectional view illustrating a display panel of FIG. 2.

FIG. 3 is a cross-sectional view illustrating a display panel of FIG. 2.

The display panel 200 may include a substrate 210, a driving layer 220, a display element layer 230, and an encapsulation layer 240. The display panel 200 may further include a protective member disposed under the substrate 210. In addition, the display panel 200 may further include various functional layers such as an anti-reflection layer and/or a refractive index adjusting layer.

The substrate 210 may include at least one plastic film. The substrate 210 may be a flexible substrate and may include a plastic substrate, a glass substrate, a metal substrate, and/or an organic/inorganic composite substrate. The substrate 210 may have a display area AR and a non-display area BR, such as is described above with reference to FIGS. 1 and 2.

The driving layer 220 may be disposed on the substrate 210. The driving layer 220 may include at least one intermediate insulating layer and a circuit element. The intermediate insulating layer may include at least one intermediate inorganic layer and/or at least one intermediate organic layer. The circuit element may include signal lines, transistors for driving a pixel, and a scan driving circuit for providing a signal to a scan line connected to the transistors.

The display element layer 230 may be disposed on the driving layer 220. The display element layer 230 may include a plurality of display elements. In an exemplary embodiment of the present invention, the display elements may be organic light emitting diodes. The organic light emitting diodes may include a first electrode, an organic light emitting layer, and a second electrode. The first electrode may be an anode or a positive electrode. The second electrode may be a negative electrode or a cathode. The first electrode may generate holes and the second electrode may generate electrons. The first electrode may inject holes into the organic light emitting layer and the second electrode may inject electrons into the organic light emitting layer. In the organic light emitting layer, the holes and the electrons may be combined with each other to form excitons and light may be emitted as the excitons transition to a relaxed state.

The display element layer 230 may further include an organic layer such as a pixel defining layer.

The encapsulation layer 240 may encapsulate the display element layer 230. The encapsulation layer 240 may include at least one inorganic layer (hereinafter, referred to as 'an encapsulation inorganic layer'). The encapsulation layer 240 may further include at least one organic layer (hereinafter, referred to as 'an encapsulation organic layer'). The encapsulation inorganic layer may protect the display element layer 230 from water and/or oxygen, and the encapsulation organic layer may protect the display element layer 230 from foreign material such as dust particles. The encapsulation inorganic layer may include a silicon nitride layer, a silicon oxynitride layer, a silicon oxide layer, a titanium oxide layer, or an aluminum oxide layer. The encapsulation organic layer may include, but is not limited to including, an acrylic-based organic layer.

The display panel 200 may further include a touch sensing unit 250 disposed on the encapsulation layer 240. The touch sensing unit 250 may obtain information on coordinates of an external input. The touch sensing unit 250 may be disposed directly on the encapsulation layer 240. In the present specification, the terms "disposed directly on" means that a component and another component thereon are formed by continuous processes except that a component is adhered to another component by using an additional adhesive layer. However, embodiments of the invention are not limited thereto. In an exemplary embodiment of the present invention, the touch sensing unit 250 may be provided as a separate independent module and may be adhered onto the encapsulation layer 240 by an adhesive.

The touch sensing unit 250 may have a multi-layered structure. The touch sensing unit 250 may include a single-layered or multi-layered conductive layer. The touch sensing unit 250 may include a single-layered or multi-layered insulating layer.

The touch sensing unit 250 may obtain information on coordinates of a point where a touch event occurs, for example, by a capacitive method. However, embodiments of the invention are not limited to the operating method of the touch sensing unit 250. The touch sensing unit 250 may sense an external input by an electromagnetic induction method or a pressure sensing method.

Figure 4:
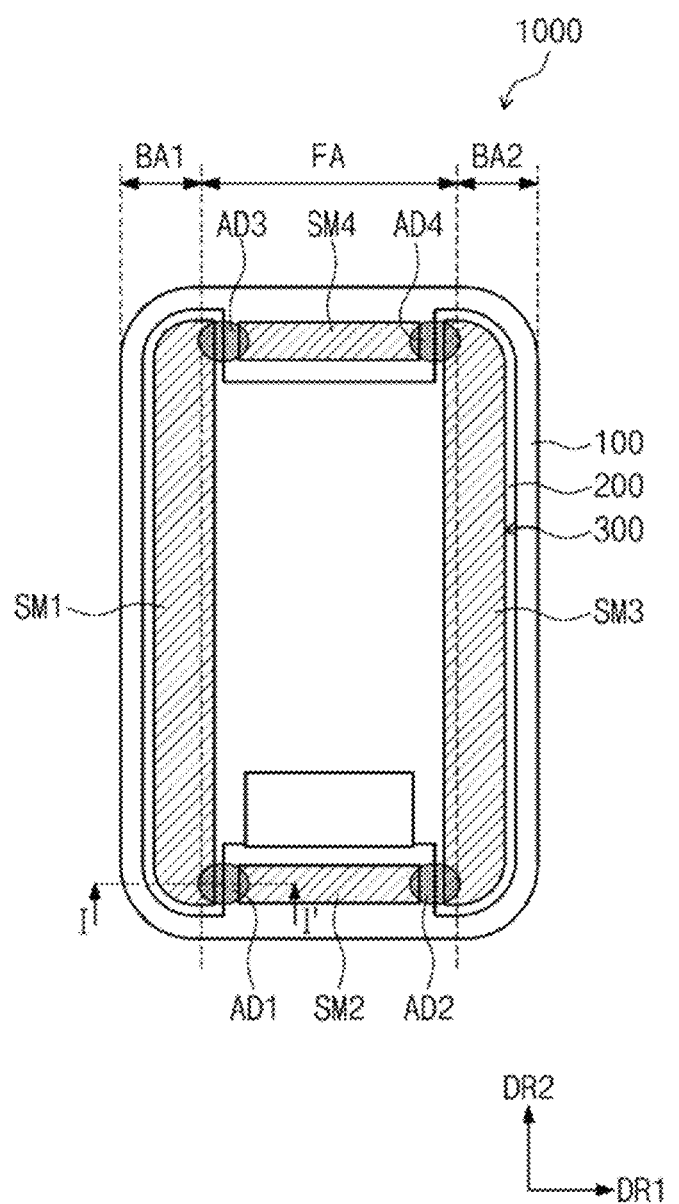
FIG. 4 is a plan view illustrating a window member, a display panel and a waterproof member according to an exemplary embodiment of the present invention.
Figure 5:
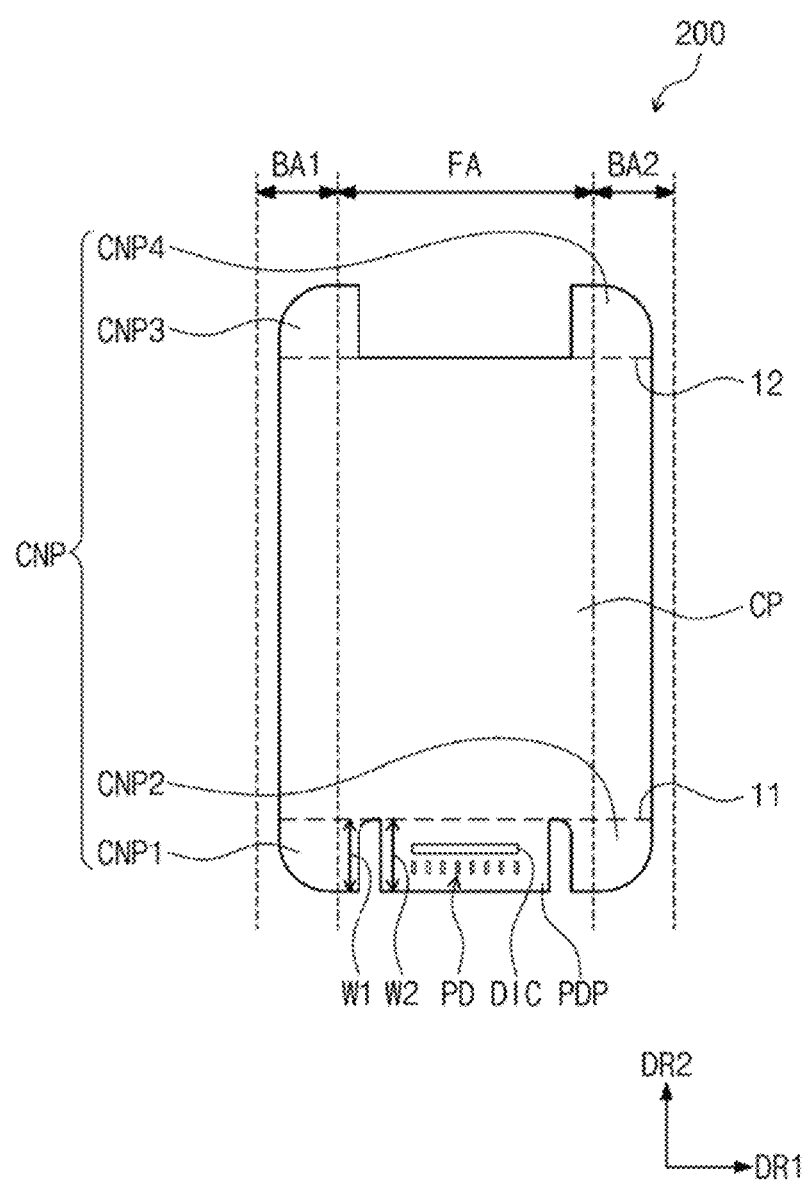
FIG. 5 is a plan view illustrating the display panel of FIG. 4.
Figure 6:
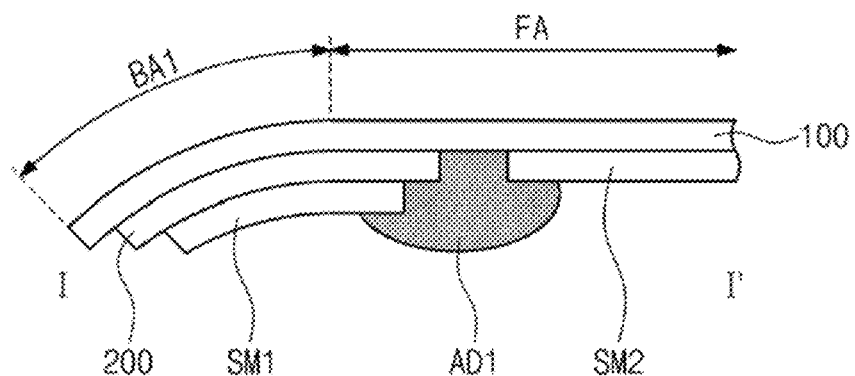
FIG. 6 is a cross-sectional view taken along a line I-I' of FIG. 4.

FIG. 4 is a plan view illustrating a window member, a display panel and a waterproof member according to an exemplary embodiment of the present invention. FIG. 5 is a plan view illustrating the display panel of FIG. 4, and FIG. 6 is a cross-sectional view taken along a line I-I' of FIG. 4.

A size of the window member 100 may be greater than that of the display panel 200 when viewed in a plan view.

A central portion CP, a corner portion CNP and a pad portion PDP may be defined within the display panel 200. The central portion CP, the corner portion CNP and the pad portion PDP may be components for describing a shape of the display panel 200. The central portion CP, the corner portion CNP and the pad portion PDP may constitute a single unitary body.

The central portion CP may have a quadrilateral shape (e.g., a rectangular shape). The central portion CP, which includes short sides extending primarily in the first direction DR1 and long sides extending primarily in the second direction DR2, is illustrated as an example in FIGS. 4 and 5.

The corner portion CNP may protrude from the short sides of the central portion CP in the second direction DR2. The corner portion CNP may overlap with the bent portion BA1 and BA2 and the flat portion FA.

In an exemplary embodiment of the present invention, the corner portion CNP may include first to fourth corner portions CNP1 to CNP4.

The first and second corner portions CNP1 and CNP2 may protrude from end portions of a first short side 11 of the central portion CP and may be spaced apart from each other.

The third and fourth corner portions CNP3 and CNP4 may protrude from end portions of a second short side 12 of the central portion CP and may be spaced apart from each other.

The first and third corner portions CNP1 and CNP3 may overlap with the first bent portion BA1 and the flat portion FA. The second and fourth corner portions CNP2 and CNP4 may overlap with the second bent portion BA2 and the flat portion FA.

The pad portion PDP may extend from the first short side 11 of the central portion CP in parallel to the second direction DR2. The pad portion PDP may overlap with the flat portion FA. The pad portion PDP may be disposed between the first and second corner portions CNP1 and CNP2 and may be spaced apart from the first and second corner portions CNP1 and CNP2.

In an exemplary embodiment of the present invention, a driving integrated circuit DIC may be mounted directly on the pad portion PDP. The driving integrated circuit DIC may provide signals necessary for driving the display panel 200. In addition, a plurality of pads PD may be disposed on the pad portion PDP. The pad portion PDP may be connected to the flexible printed circuit board or the printed circuit board through the pads PD. When the display device 1000 is assembled, the pad portion PDP may be bent to be disposed on a rear surface of the central portion CP. FIG. 4 illustrates a state in which the pad portion PDP is bent, and FIG. 5 illustrates a state in which the pad portion PDP is stretched out. In FIG. 5, the driving integrated circuit DIC mounted directly on the pad portion PDP is illustrated as an example. However, embodiments of the invention are not limited thereto. For example, an exemplary embodiment of the present invention, the driving integrated circuit DIC might not be mounted on the pad portion PDP but may be mounted on a flexible printed circuit board connected to the pad portion PDP.

A width W1 of each of the first and second corner portions CNP1 and CNP2 in the second direction DR2 may be equal to or less than a width W2 of the pad portion PDP in the second direction DR2. Thus, when the display panel 200 is cut from a mother substrate, the first and second corner portions CNP1 and CNP2 having the width W1 less than the width W2 of the pad portion PDP may be formed. As a result, it is possible to inhibit or prevent a yield of the display panel 200 from being reduced by the first and second corner portions CNP1 and CNP2.

The waterproof member 300 may include sealing members SM1 to SM4 and adhesives AD1 to AD4.

The first to fourth sealing members SM1 to SM4 may be adhesive films.

The first sealing member SM1 may be disposed on a rear surface of the display panel 200 and may have a shape extending primarily along a long side of the display panel 200 in the second direction DR2. The first sealing member SM1 may overlap with the first and third corner portions CNP1 and CNP3 and the central portion CP. The first sealing member SM1 may overlap with the first bent portion BA1 and the flat portion FA.

The second sealing member SM2 may be disposed on a rear surface of the window member 100 and may have a shape which extends primarily in the first direction DR1 outside the first short side 11 of the central portion CP of the display panel 200. The second sealing member SM2 may be spaced apart from the display panel 200 and may be disposed between the first and second corner portions CNP1 and CNP2. The second sealing member SM2 may overlap with the flat portion FA.

The third sealing member SM3 may be disposed on the rear surface of the display panel 200 and may have a shape extending primarily along another long side of the display panel 200 in the second direction DR2. The third sealing member SM3 may overlap with the second and fourth corner portions CNP2 and CNP4 and the central portion CP. The third sealing member SM3 may overlap with the second bent portion BA2 and the flat portion FA.

The fourth sealing member SM4 may be disposed on the rear surface of the window member 100 and may have a shape which extends primarily in the first direction DR1 outside the second short side 12 of the central portion CP of the display panel 200. The fourth sealing member SM4 may be spaced apart from the display panel 200 and may be disposed between the third and fourth corner portions CNP3 and CNP4. The fourth sealing member SM4 may overlap with the flat portion FA.

The adhesive AD1 to AD4 may include first to fourth adhesives AD1 to AD4. The first to fourth adhesives AD1 to AD4 may be curable resin.

The first adhesive AD1 may be adhered to the first sealing member SM1 and the second sealing member SM2 to prevent water from permeating between the first sealing member SM1 and the second sealing member SM2.

The second adhesive AD2 may be adhered to the second sealing member SM2 and the third sealing member SM3 to prevent water from permeating between the second sealing member SM2 and the third sealing member SM3.

The third adhesive AD3 may be adhered to the first sealing member SM1 and the fourth sealing member SM4 to prevent water from permeating between the first sealing member SM1 and the fourth sealing member SM4.

The fourth adhesive AD4 may be adhered to the third sealing member SM3 and the fourth sealing member SM4 to prevent water from permeating between the third sealing member SM3 and the fourth sealing member SM4.

The first to fourth sealing members SM1 to SM4 and the first to fourth adhesives AD1 to AD4 may prevent water from permeating into a space between the display panel 200 and the bracket 500.

The first to fourth sealing members SM1 and SM4 and the first to fourth adhesives AD1 to AD4 may be adhered to the bracket 500 described above with reference to FIG. 2.

In a comparative example of the present invention, components may be at least similar to corresponding components that have already been described. In the comparative example of the present invention, a space between a first sealing member and a second sealing member may be defined within a bent portion, and a first adhesive portion may overlap with the bent portion and may be adhered to the first sealing member and the second sealing member. In this case, in the bent portion of a display panel, a plurality of layers constituting the display panel may be separated from each other due to differences in restoring force between the plurality of layers. Thus, water may permeate to a rear surface of the display panel through a space between the plurality of layers.

However, in the display device, according to an exemplary embodiment of the present invention, the first to fourth adhesives AD1 to AD4 may fill spaces between the first, second, third and fourth sealing members SM1 to SM4, which are defined within the flat portion FA. In the invention, even though the layers constituting the display panel 200 are separated from each other in the bent portions BA1 and BA2 of the display panel 200, the layers constituting the display panel 200 are not separated from each other in the flat portion FA of the display panel 200, and the first to fourth adhesives AD1 to AD4 can prevent water from permeating to the rear surface of the display panel 200.

Figure 7:
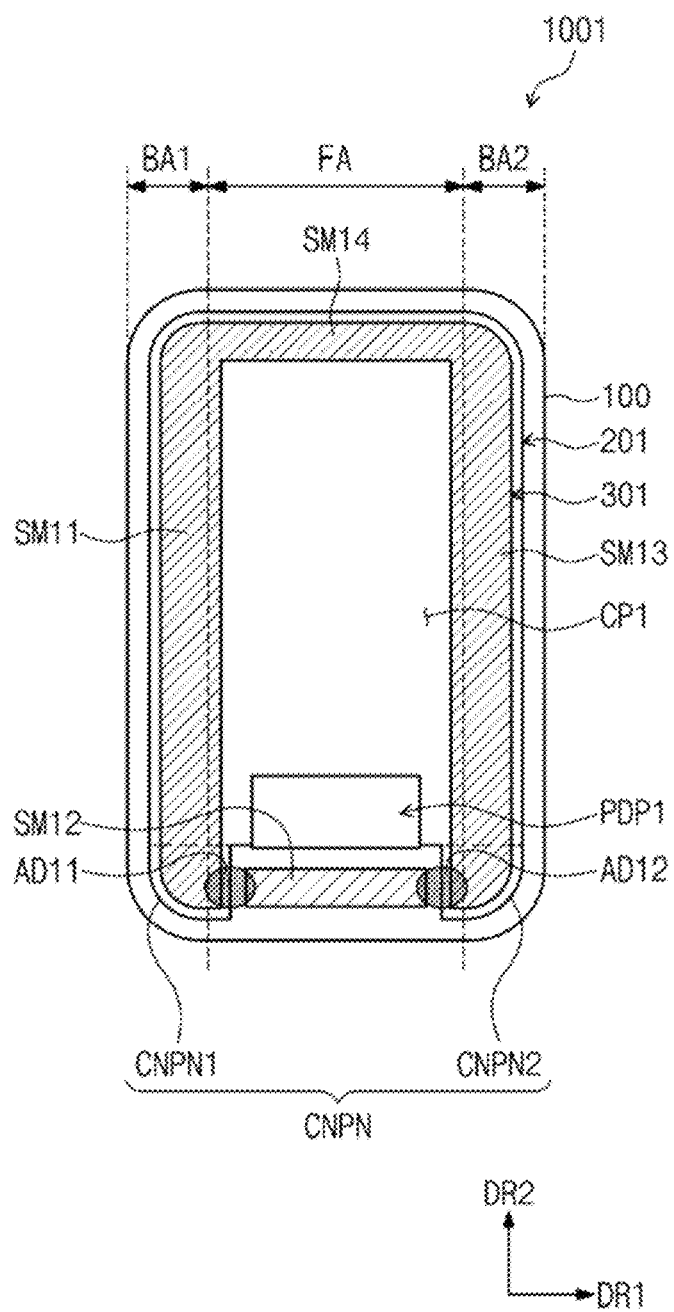
FIG. 7 is a plan view illustrating a window member, a display panel and a waterproof member in a display device according to an exemplary embodiment of the present invention.

FIG. 7 is a plan view illustrating a window member, a display panel and a waterproof member in a display device according to an exemplary embodiment of the present invention.

Hereinafter, differences between a display device 1001 of FIG. 7 and the display device 1000 of FIGS. 4 to 6 will be mainly described, and unexplained features of the display device 1001 may be understood to be substantially the same as corresponding features of the display device 1000 of FIGS. 4 to 6.

A central portion CP1, a corner portion CNPN and a pad portion PDP1 may be defined within a display panel 201.

The corner portion CNPN may include first and second corner portions CNPN1 and CNPN2. The first and second corner portions CNPN1 and CNPN2 may be substantially the same as the first and second corner portions CNP1 and CNP2 described with reference to FIG. 4.

A waterproof member 301 may include a sealing member SM11, SM12, SM13 and SM14 and an adhesive AD11 and AD12.

A first sealing member SM11 may be disposed on a rear surface of the display panel 201 and may have a shape extending primarily along a long side of the display panel 201 in the second direction DR2. The first sealing member SM11 may overlap with the first corner portion CNPN1 and the central portion CP1.

A second sealing member SM12 may be disposed on a rear surface of a window member 100 and may have a shape which extends primarily in the first direction DR1 outside a short side of the display panel 201. The second sealing member SM12 may be spaced apart from the display panel 201 and may be disposed between the first and second corner portions CNPN1 and CNPN2. The second sealing member SM12 may overlap with the flat portion FA.

A third sealing member SM13 may be disposed on the rear surface of the display panel 201 and may have a shape extending primarily along another long side of the display panel 201 in the second direction DR2. The third sealing member SM13 may be spaced apart from the first sealing member SM11 in the first direction DR1. The third sealing member SM13 may overlap with the second corner portion CNPN2 and the central portion CP1.

A fourth sealing member SM14 may be disposed on the rear surface of the display panel 201 and may have a shape extending primarily along another short side of the display panel 201 in the first direction DR1. The fourth sealing member SM14 may be connected to the first and third sealing members SM11 and SM13.

The first, third and fourth sealing members SM11, SM13 and SM14 may constitute a single unitary body.

The adhesive AD11 and AD12 may include first and second adhesives AD1 and AD12.

The first adhesive AD11 may be adhered to the first sealing member SM11 and the second sealing member SM12 to prevent water from permeating between the first sealing member SM11 and the second sealing member SM12.

The second adhesive AD12 may be adhered to the second sealing member SM12 and the third sealing member SM13 to prevent water from permeating between the second sealing member SM12 and the third sealing member SM13.

When the display panel 201 of the display device 1001 has two corner portions CNPN1 and CNPN2, the first, third and fourth sealing members SM11, SM13 and SM14 constituting the single unitary body may be adhered to the rear surface of the display panel 201. Thus, the first and second adhesives AD11 and AD12 may prevent water from permeating to the rear surface of the display panel 201.

Figure 8:
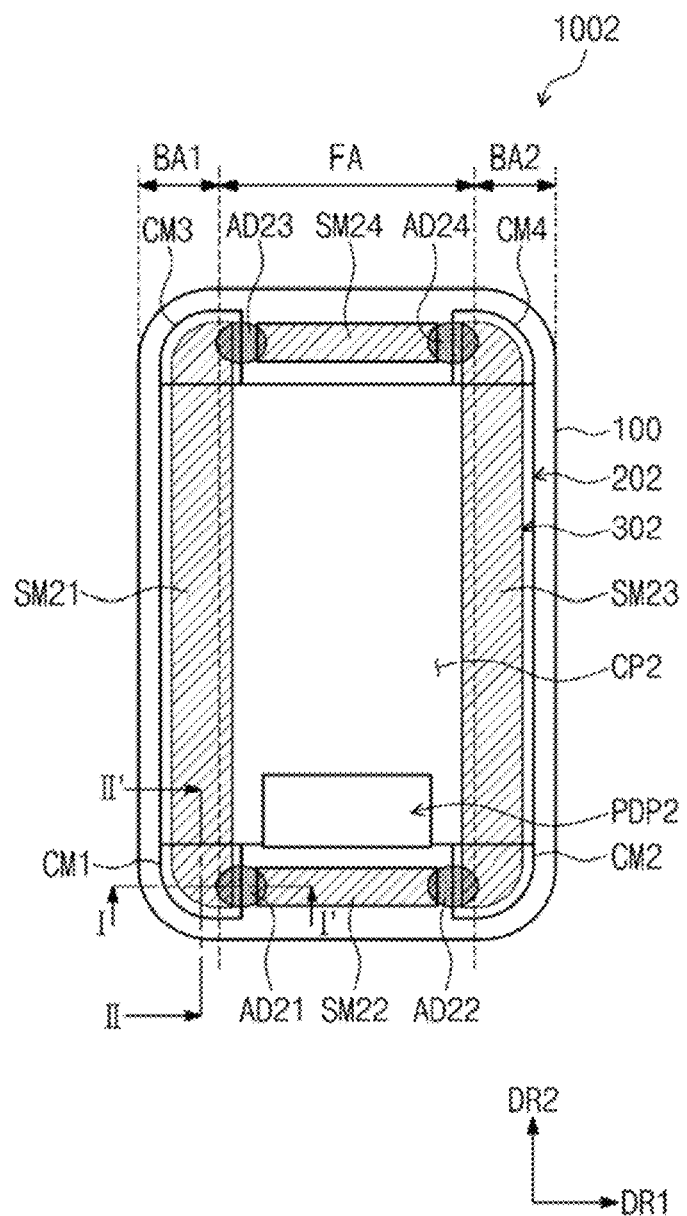
FIG. 8 is a plan view illustrating a window member, a display panel and a waterproof member in a display device according to an exemplary embodiment of the present invention.
Figure 9A:
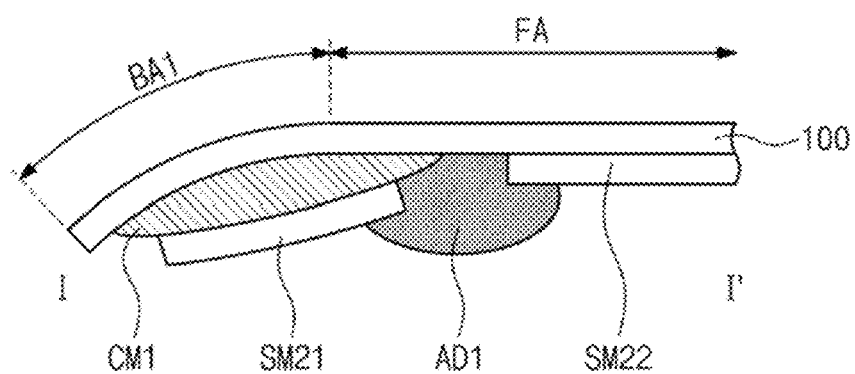
FIG. 9A is a cross-sectional view taken along a line I-I' of FIG. 8.
Figure 9B:
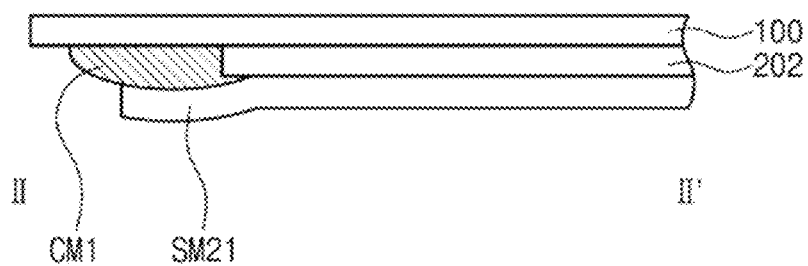
FIG. 9B is a cross-sectional view taken along a line II-II' of FIG. 8.

FIG. 8 is a plan view illustrating a window member, a display panel and a waterproof member in a display device according to an exemplary embodiment of the present invention, FIG. 9A is a cross-sectional view taken along a line I-I' of FIG. 8, and FIG. 9B is a cross-sectional view taken along a line II-II' of FIG. 8.

Hereinafter, differences between a display device 1002 of FIGS. 8, 9A and 9B and the display device 1000 of FIGS. 4 to 6 will be mainly described, and unexplained features of the display device 1002 may be substantially the same as corresponding features of the display device 1000 of FIGS. 4 to 6.

A central portion CP2 and a pad portion PDP2 may be defined within a display panel 202 of the display device 1002.

Unlike the display panel 200 of FIG. 4, the first to fourth corner portions CNP1 to CNP4 are not defined within the display panel 202.

The display device 1002 may further include first to fourth compensation parts CM1 to CM4.

The first to fourth compensation parts CM1 to CM4 may be disposed at positions at which the first to fourth corner portions CNP1 to CNP4 of the display panel 200 of FIG. 4 are disposed. Planar shapes of the first to fourth compensation parts CM1 to CM4 may be substantially the same as those of the first to fourth corner portions CNP1 to CNP4 described with reference to FIG. 4.

The first to fourth compensation parts CM1 to CM4 may be in contact with the window member 100 and the display panel 202. In an exemplary embodiment of the present invention, the first to fourth compensation parts CM1 to CM4 may be curable resin and may partially overlap with the central portion CP2. The first to fourth compensation parts CM1 to CM4 may be in contact with a rear surface of the display panel 202.

A waterproof member 302 may include a sealing member SM21 to SM24 and an adhesive AD21 to AD24.

The first to fourth sealing members SM21 to SM24 may have the same shapes as the first to fourth sealing members SM1 to SM4 described with reference to FIGS. 4 to 6 when viewed in a plan view, and thus to the extent that details are omitted herein with respect to sealing member SM21 to SM24, it may be assumed that the omitted details are at least similar to those described above as the first to fourth sealing members SM1 to SM4 described with reference to FIGS. 4 to 6.

The first to fourth adhesives AD21 to AD24 may have the same shapes as the first to fourth adhesives AD1 to AD4 described with reference to FIGS. 4 to 6 when viewed in a plan view, and thus to the extent that details are omitted herein with respect to the first to fourth adhesives AD21 to AD24, it may be assumed that the omitted details are at least similar to those described above as the first to fourth adhesives AD1 to AD4 described with reference to FIGS. 4 to 6.

According to the display device 1002 described with reference to FIGS. 8, 9A and 9B, the substantially same effects as the above embodiments in which the shape of the display panel is changed may be obtained by the first to fourth compensation parts CM1 to CM4 without changing the shape of the display panel 202. Thus, it is possible to effectively prevent water from permeating to the rear surface of the display panel 202.

According to the display device and the portable terminal in the embodiments of the invention, the display device may have the flat portion and the bent portion and may effectively prevent water from permeating to the rear surface of the display panel.

Even though the layers constituting the display panel are separated from each other in the bent portion of the display panel, the layers of the display panel might not be separated from each other in the flat portion of the display panel and the adhesive may prevent water from permeating to the rear surface of the display panel.

While the invention has been described with reference to example embodiments, it will be apparent to those skilled in the art that various changes and modifications may be made without departing from the spirits and scopes of the invention.

What is claimed is:

1. A display device, comprising:
a window member comprising a flat portion and a bent portion connected to the flat portion;
a display panel disposed on a rear surface of the window member and comprising a central portion and a corner portion protruding from the central portion and overlapping with the flat portion and the bent portion;
a first sealing member disposed on a rear surface of the display panel and overlapping with the corner portion;
a second sealing member disposed on the rear surface of the window member and spaced apart from the central portion and the corner portion; and
a first adhesive contacting the first sealing member and the second sealing member and sealing a space which is defined between the first sealing member and the second sealing member in the flat portion.

2. The display device of claim 1, wherein the corner portion comprises first and second corner portions which protrude from one side of the central portion,
wherein the first and second corner portions are spaced apart from each other, and
wherein the second sealing member is disposed between the first and second corner portions.

3. The display device of claim 2, further comprising:
a third sealing member which is disposed on the rear surface of the display panel, overlaps with the second corner portion, and is spaced apart from the first sealing member, and
a second adhesive contacting the second sealing member and the third sealing member and sealing a space which is defined between the second sealing member and the third sealing member in the flat portion,
wherein the first sealing member overlaps with the first corner portion.

4. The display device of claim 3, further comprising:
a fourth sealing member disposed on the rear surface of the window member,
wherein the corner portion further comprises third and fourth corner portions which protrude from another side of the central portion and are spaced apart from each other,
wherein the another side of the central portion is opposite to the one side of the central portion, and
wherein the fourth sealing member is disposed between the third and fourth corner portions.

5. The display device of claim 4, further comprising:
a third adhesive in contact with the first sealing member and the fourth sealing member to seal a space which is defined between the first sealing member and the fourth sealing member in the flat portion; and
a fourth adhesive contacting with the third sealing member and the fourth sealing member and sealing a space which is defined between the third sealing member and the fourth sealing member in the flat portion,
wherein the first sealing member overlaps with the third corner portion, and the third sealing member overlaps with the fourth corner portion.

6. The display device of claim 3, further comprising:
a fourth sealing member disposed on the rear surface of the display panel and connected to the first sealing member and the third sealing member.

7. The display device of claim 1, further comprising:
a bracket configured to support the display panel and to which the first sealing member, the second sealing member and the first adhesive are adhered.

8. The display device of claim 1, wherein the bent portion comprises: a first bent portion and a second bent portion, which are opposite to each other with the flat portion interposed therebetween.

9. The display device of claim 1, further comprising:
a driving circuit configured to provide a signal for driving the display panel,
wherein the display panel further comprises a pad portion which protrudes from the central portion and is spaced apart from the corner portion and on which the driving circuit is mounted, and
wherein the pad portion is bent to overlap with the central portion.

10. A display device, comprising:
a window member comprising a flat portion and a bent portion connected to the flat portion;
a display panel disposed on a rear surface of the window member;
a compensation part disposed on the rear surface of the window member, protruding from the display panel, and overlapping with the flat portion and the bent portion;
a first sealing member disposed on a rear surface of the display panel and a rear surface of the compensation part and overlapping with the compensation part;
a second sealing member disposed on the rear surface of the window member and spaced apart from the display panel and the compensation part; and
a first adhesive contacting with the first sealing member and the second sealing member and sealing a space which is defined between the first sealing member and the second sealing member in the flat portion.

11. The display device of claim 10, wherein the compensation part overlaps with the display panel and is in contact with the display panel.

12. The display device of claim 10, wherein the compensation part comprises first and second compensation parts which protrude from one side of the display panel and which are spaced apart from each other, and
wherein the second sealing member is disposed between the first and second compensation parts.

13. The display device of claim 12, further comprising:
a third sealing member disposed on the rear surface of the display panel, overlapping with the second compensation part, and spaced apart from the first sealing member; and
a second adhesive contacting the second sealing member and the third sealing member and sealing a space which is defined between the second sealing member and the third sealing member in the flat portion,
wherein the first sealing member overlaps with the first compensation part.

14. The display device of claim 13, further comprising:
a fourth sealing member disposed on the rear surface of the window member,
wherein the compensation part further comprises third and fourth compensation parts which protrude from another side of the display panel and are spaced apart from each other,
wherein the another side of the display panel is opposite to the one side of the display panel, and
wherein the fourth sealing member is disposed between the third and fourth compensation parts in the first direction.

15. The display device of claim 14, further comprising:
a third adhesive contacting the first sealing member and the fourth sealing member and sealing a space which is defined between the first sealing member and the fourth sealing member in the flat portion; and
a fourth adhesive contacting with the third sealing member and the fourth sealing member and sealing a space which is defined between the third sealing member and the fourth sealing member in the flat portion,
wherein the first sealing member overlaps with the third compensation part, and the third sealing member overlaps with the fourth compensation part.

16. A portable terminal, comprising:
a window member comprising a flat portion and a bent portion connected to the flat portion;
a display panel disposed on a rear surface of the window member and comprising a central portion and a corner portion protruding from the central portion and overlapping with the flat portion and the bent portion;
a first sealing member disposed on a rear surface of the display panel and overlapping with the corner portion;
a second sealing member disposed on the rear surface of the window member and spaced apart from the central portion and the corner portion; and
a first adhesive contacting the first sealing member and the second sealing member and sealing a space which is defined between the first sealing member and the second sealing member in the flat portion.

17. The portable terminal of claim 16, further comprising:
a bracket which supports the display panel and to which the first sealing member, the second sealing member and the first adhesive are adhered; and
a back case configured to receive the display panel and the bracket and coupled to the window member.

18. The portable terminal of claim 16, wherein the first adhesive includes curable resin.

19. The portable terminal of claim 16, wherein the corner portion comprises first and second corner portions which protrude from one side, extending primarily in a first direction, of the central portion in a second direction intersecting the first direction and which are spaced apart from each other, and
wherein the second sealing member is disposed between the first and second corner portions in the first direction.

20. The portable terminal of claim 19, further comprising:
a third sealing member which is disposed on the rear surface of the display panel, overlaps with the second corner portion, and is spaced apart from the first sealing member; and
a second adhesive contacting the second sealing member and the third sealing member and sealing a space which is defined between the second sealing member and the third sealing member in the flat portion,
wherein the first sealing member overlaps with the first corner portion.

21. A display device, comprising:
a front window;
a back case;
a curved display panel disposed between the front window and the back case and including a first-side bending area, a second-side bending area and a flat area disposed between the first-side bending area and the second-side bending area;
a first-side sealing member disposed between the curved display panel and the back case, the first-side sealing member overlapping with the first-side bending area and the flat area;
a second-side sealing member disposed between the curved display panel and the back case, the second-side sealing member overlapping with the second-side bending area and the flat area; and
an adhesive disposed in contact with the first-side sealing member and the second-side sealing member and overlapping with the flat area and not the first-side bending area or the second-side bending area.

* * * * *